(12) United States Patent
Sicard et al.

(10) Patent No.: US 10,224,923 B2
(45) Date of Patent: Mar. 5, 2019

(54) METHOD AND APPARATUS FOR DRIVING A POWER TRANSISTOR GATE

(71) Applicants: Thierry Sicard, Auzeville Tolosane (FR); Philippe Perruchoud, Tournefeuille (FR)

(72) Inventors: Thierry Sicard, Auzeville Tolosane (FR); Philippe Perruchoud, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 246 days.

(21) Appl. No.: 14/436,740

(22) PCT Filed: Oct. 31, 2012

(86) PCT No.: PCT/IB2012/002653
§ 371 (c)(1),
(2) Date: Apr. 17, 2015

(87) PCT Pub. No.: WO2014/068352
PCT Pub. Date: May 8, 2014

(65) Prior Publication Data
US 2015/0288356 A1      Oct. 8, 2015

(51) Int. Cl.
| H03K 17/16 | (2006.01) |
| H03K 17/14 | (2006.01) |
| H03K 17/567 | (2006.01) |
| H03K 17/0412 | (2006.01) |

(52) U.S. Cl.
CPC ......... *H03K 17/14* (2013.01); *H03K 17/0412* (2013.01); *H03K 17/567* (2013.01)

(58) Field of Classification Search
CPC ....... H01L 2924/00; H01L 2924/00014; H01L 2924/1305; H01L 2924/1306; H01L 2924/13091
See application file for complete search history.

(56) References Cited

U.S. PATENT DOCUMENTS

| 5,939,927 | A |   | 8/1999 | Myers |
| 5,952,949 | A | * | 9/1999 | Coy ......................... H03K 4/06 327/142 |
| 6,094,087 | A | * | 7/2000 | He ...................... H02M 1/4225 327/376 |
| 6,208,185 | B1 |   | 3/2001 | John et al. |
| 6,271,709 | B1 |   | 8/2001 | Kimura et al. |
| 6,275,093 | B1 |   | 8/2001 | Shekhawat et al. |
| 6,326,819 | B1 |   | 12/2001 | Carlson |

(Continued)

OTHER PUBLICATIONS

International Search Report and Written Opinion correlating to PCT/IB2012/002653 dated Nov. 25, 2014.

*Primary Examiner* — Sibin Chen
(74) *Attorney, Agent, or Firm* — Charlene R. Jacobsen

(57) ABSTRACT

A gate drive circuit includes a first switch electrically coupled to a single-supply input voltage node, the first switch electrically coupling the voltage node with a first capacitor if switched on; a second switch electrically coupled to a ground node, the second switch electrically coupling the first capacitor with the ground node if switched on; and the first capacitor. A first capacitor lead of the first capacitor is electrically coupled to the first and second switches and a second capacitor lead of the first capacitor is arranged to connect with a power transistor gate.

19 Claims, 7 Drawing Sheets

(56) References Cited

U.S. PATENT DOCUMENTS

| | | | |
|---|---|---|---|
| 7,109,780 B2* | 9/2006 | Miettinen | H03K 17/0406 |
| | | | 327/434 |
| 7,701,279 B2 | 4/2010 | Scollo et al. | |
| 2005/0161761 A1* | 7/2005 | Hatade | H01L 27/088 |
| | | | 257/487 |
| 2007/0139095 A1* | 6/2007 | Fang | H02M 1/08 |
| | | | 327/432 |
| 2007/0164718 A1* | 7/2007 | Nishi | H02M 3/158 |
| | | | 323/284 |
| 2010/0019807 A1 | 1/2010 | Zhang et al. | |
| 2011/0050322 A1 | 3/2011 | Sicard | |
| 2011/0194451 A1 | 8/2011 | Sims | |
| 2011/0273206 A1 | 11/2011 | Lee | |
| 2012/0126859 A1* | 5/2012 | Kawamoto | H03K 17/163 |
| | | | 327/108 |

* cited by examiner

US 10,224,923 B2

METHOD AND APPARATUS FOR DRIVING A POWER TRANSISTOR GATE

FIELD OF THE INVENTION

This invention relates to circuits and methods for driving a power transistor gate.

BACKGROUND OF THE INVENTION

An isolated gate-electrode of an insulated-gate bipolar transistor (IGBT) may form a capacitor (e.g., a gate capacitor or gate capacitance), which may have to be charged or discharged each time the IGBT is switched on or off. As a transistor may require a particular gate voltage in order to switch on, the gate capacitor may have to be charged to at least the required gate voltage for the transistor to be switched on. Similarly, to switch the transistor off, this voltage must be dissipated.

When such a transistor is switched on or off, it does not immediately switch from a non-conducting to a conducting state. The transistor may first have to overcome a certain amount of resistance. This resistance may be a function of the above-mentioned gate capacitance. Consequently, when a switching signal is applied to the transistor gate, a certain amount of heat may be generated which may be enough to destroy the transistor. Therefore, it may be beneficial to keep the switching time as short as possible, so as to minimize switching loss. Switching times may be in the range of microseconds and even nanoseconds. The switching time of a transistor may be inversely proportional to the amount of current used to charge the gate. Therefore, switching currents may be required in the range of, e.g., several hundred milliamperes, or even in the range of amperes. For typical gate voltages, approximately 10-15V, several watts of power may be required to drive the switch.

The switching signal for a transistor may be generated by a logic circuit or a microcontroller. The logic circuit or the microcontroller may provide an output signal that typically is limited to a few milliamperes of current. This is insufficient current, which may cause a power transistor gate to draw current too quickly such that it causes a current overdraw in the logic circuit or microcontroller and possible damage. To prevent this from happening, a gate drive is provided between the microcontroller output signal and a power transistor (e.g., an IGBT or MOSFET).

Typically, such a gate drive is provided with a dual power supply for facilitating switching an IGBT on and off.

SUMMARY OF THE INVENTION

The present invention provides circuits and methods for driving an insulated-gate bipolar transistor (IGBT) gate as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The terms "IGBT gate capacitor" and "IGBT gate capacitance" may refer to the equivalent capacitance that may be charged and discharged within a power transistor gate in order to switch the power transistor on and off. One example of a gate capacitor is the "capacitor" formed by an isolated gate-electrode of an IGBT forms a capacitor. An "IGBT module" refers to a module housing with at least one IGBT but may also include modules with several IGBTs in parallel or in a bridge topology.

Figure 1:
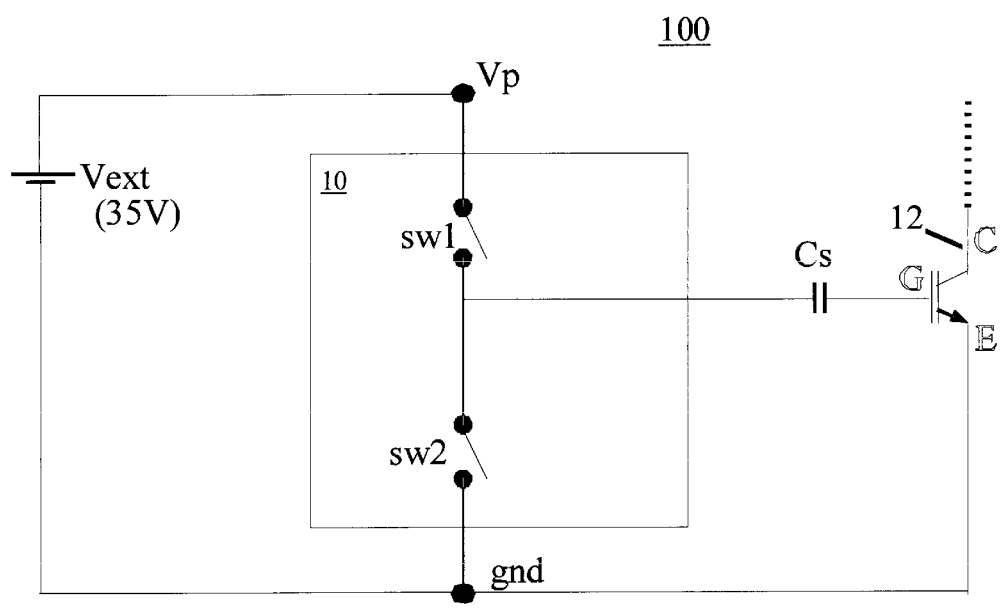
FIG. 1 schematically shows an example of an embodiment of a gate drive circuit.

FIG. 1 schematically shows an example of an embodiment of a gate drive circuit 100. Gate drive circuit 100 may include single voltage supply Vext, gate drive 10, capacitor Cs, and IGBT 12. Gate drive 10 may include switches sw1 and sw2, for example, each connected to power supply node Vp and ground node gnd. Gate drive 10 may be an IC, for example. The capacitor Cs may reside within gate drive 10, for example. Gate drive 10 and capacitor Cs may form a complete gate drive circuit, for example. Vext may be turned on and off and/or connected and disconnected from the rest of the circuit 100, for example.

The topography of circuit 100 allows gate drive 10 to be driven with a single voltage supply Vext, without the need of an additional negative supply to discharge gate capacitance. Capacitor Cs may be charged and discharged in-phase with the gate capacitance. Gate drive circuit 100 may be implemented as a single switch or arranged in a bridge topology with similar circuits.

One problem associated with operating an IGBT may be parasitic turn-on due to gate capacitance. This effect may be noticeable in single supply drivers. In particular, a high dV/dt transient created during IGBT turn-off or turn-on may induce a parasitic turn-on (e.g., a gate voltage spike) in another IGBT, which may cause damage or destroy a gate drive circuit.

For example, IGBT 12 may be a lower IGBT of a bridge topography, i.e., collector C may be electrically coupled to an upper IGBT to form a bridge. When turning on the upper IGBT, a voltage change dVCE/dt may occur across IGBT 12. A current may flow through a parasitic capacitor of IGBT 12, a resistance electrically connected to gate G, and an internal gate resistor. This current creates a voltage drop across a resistance electrically connected to gate G. If this voltage exceeds the IGBT gate threshold voltage, a parasitic turn-on occurs.

A technique associated with the prior art includes supplying a negative gate voltage to safely turn-off and block a lower IGBT.

In contrast, the present invention includes capacitor Cs, which may be connected in series with gate G. Capacitor Cs may discharge to provide a transient negative supply for IGBT 12 that prevents or ameliorates parasitic turn-on.

For example, the serial capacitor Cs may be pre-charged at 10V using sw1. When sw1 may be active, Cs and the IGBT gate capacitor are charged at the same time. When sw2 may be active, Cs and the IGBT gate capacitor are discharged at the same time and the potential at gate G may be, for example, −10V for the short time that sw2 may be active. Cs may be 100 times larger than the IGBT gate capacitor.

Figure 2:
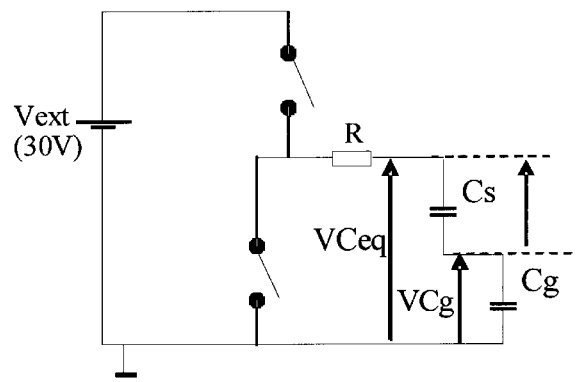
FIG. 2 schematically shows a circuit model based on the circuit of FIG. 1.

Another aspect of circuit 100 may be having a lower current requirement to drive IGBT 12. To explain further, FIG. 2 schematically shows a circuit model based on circuit 100 of FIG. 1. R may be a model resistance. Cg may be equal to the gate capacitance, wherein the equivalent capacitance of circuit 100 may be modeled as Ceq=1/(1/Cs+1/Cg) In particular, the topology may be based on the assumption that the equivalent capacitance of circuit 100 may be approximately equal to capacitor Cs and gate capacitance in series.

Figure 3:
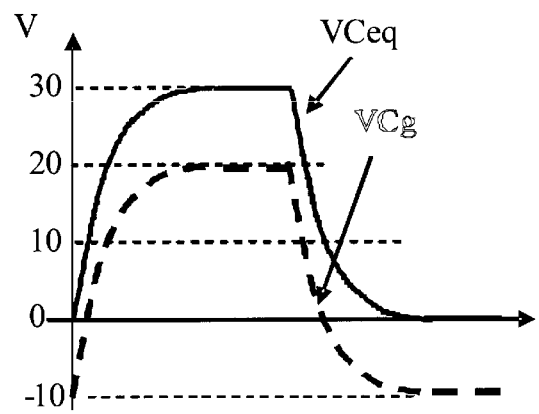
FIG. 3 is a chart showing example voltage charge and discharge rates based on the circuit model of FIG. 2.
Figure 3:
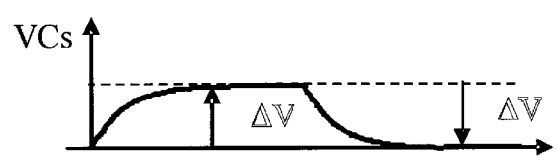

FIG. 3 may be a chart showing voltage charge and discharge rates of VCeq and VCg. With this topology (i.e., capacitor Cs in series with Cg), only ΔQ may be taken from Vext because Cs may be charged and discharged from the same ΔV value, so Cs does not need any current re-charge, as normally required in dual-supply circuits. That is, ΔQ=ΔV*Cg. According to FIG. 3, Cs may be charged to 10 volts to provide the transient negative gate voltage upon discharge.

Figure 4:
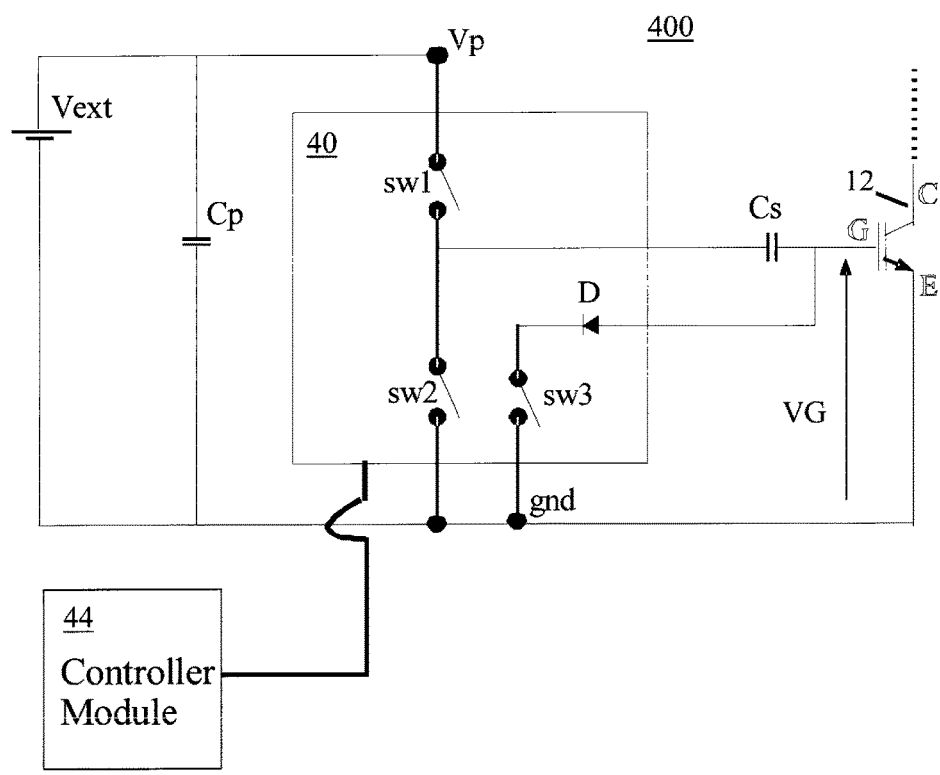
FIG. 4 schematically shows another example of an embodiment of a gate drive circuit.

In dual supply voltage topologies, however, after the charge and discharge of Cg by ΔV, Vext needs to provide 2ΔQ (i.e., a charge for each power supply). Because ΔQ=I*t, twice the current amplitude (i.e., 2I) may be needed. Vext may be provided by a supply capacitor (e.g., capacitor Cp), as shown in FIG. 4. Thus, in single supply voltage topologies of the present invention, after the charge and discharge of Cg by ΔV, re-charging the supply capacitor may require only one ΔQ. Further, because ΔQ=I*t, re-charging the supply capacitor requires only "I" current amplitude.

Although power may be constant between each topology, the single supply voltage topologies of the present invention need half the current compared to dual-supply topologies.

FIG. 4 schematically shows another example of an embodiment of gate drive circuit 400. The identification of the features shared with FIG. 1 will not be repeated in describing FIG. 4. Circuit 400 further includes capacitor Cp, switch sw3, diode D, and control module 44. Capacitor Cp may act as a power supply in cases where Vext may be disconnected or switched off, for example. Capacitor Cp, driver 40, and capacitor Cs may form a complete drive circuit.

Control module 44 provides, for example, control signal to control the output of gate drive 40. Switches sw1, sw2, and/or sw3 may be passively switched (e.g., by a voltage supplied by Cp) and/or may be passively and actively switched at different times (e.g., passively switched on but actively switched off).

Figure 5:
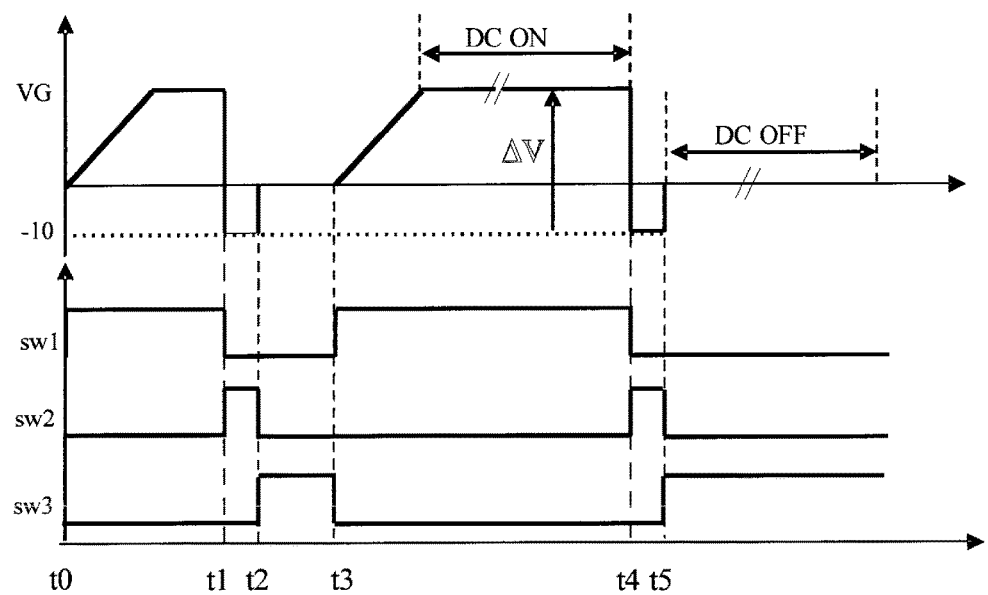
FIG. 5 is a timing diagram showing a gate voltage in relation to a switching pattern based on the circuit of FIG. 4.

FIG. 5 is a timing diagram showing a gate voltage in relation to a switching pattern based on circuit 400 of FIG. 4. Capacitor Cp may be charged by Vext before time t0 and discharged at time t0 to switch sw1 on. Switch sw1 may be actively switched in response to a signal sent from control module 44. In either case, sw1 may be switched on at t0.

Capacitors Cp and Cs may be charged substantially concurrently. Thus, switch sw1 may provide two main functionalities: driving IGBT 12 gate turn on (e.g., raising VG) and pre-charging capacitor Cs. The pre-charge amount may result in a 10V potential across capacitor Cs.

Capacitor Cs may not, for example, be a supply capacitor and may not, for example, be able to maintain a negative DC voltage. Thus, at time t1, where sw1 may be switched off and sw2 may be switched on, a transient negative voltage may be applied to gate G by capacitor Cs being electrically coupled to ground. The time constant of capacitor Cs may be configured such that Cs discharges in, for example, 500 microseconds.

This aspect is based on the insight that a negative voltage may be mandatory only during a fast dVce/dt of an IGBT (e.g., IGBT turn on). For example, an IGBT electrically coupled with IGBT 12 when IGBT 12 may be turned or turning off (e.g., a fast dVce/dt at times t1 and t4). For example, in a bridge topology a high dv/dt may be applied to collector C of IGBT 12 during the off-state when opposing or high-side devices are turned on. The high dv/dt may cause parasitic turn on of IGBT 12. This behavior may be caused by parasitic collector to gate (miller) capacitance, effectively forming a capacitive divider with the gate to emitter capacitance and thus inducing a gate to emitter voltage.

At time t2, sw2 may be switched off, and sw3 may be switched on. Sw3 may maintain a low DC state voltage that corresponds with a DC off state or similar state of IGBT 12. For example, t0 to t3 may be a start up sequence enabling capacitor Cp to pre-charge before "normal" operation (e.g., t3 to sometime after t5).

At time t3, sw3 may be switched off, and sw1 may be switched on. Capacitor Cp may be a supply voltage driving driver 40, which may include switching sw1 on and charging capacitor Cs. Gate voltage VG may also increase until IGBT 12 may be turned on (i.e., a conducting state).

Times t4 to t5 may involve the same switching activity as time t1 to t2. The time period of t4 to t5 may differ from the time period t1 to t2 (e.g., be shorter or longer).

VG gate voltage may be kept at 15V, and capacitor voltage VCs (not shown) may be clamped at 10V during DC ON. Gate voltage VG may be kept at 1Vd, wherein Vd may be the diode drop voltage of diode D. When sw3 may be on, gate G may be clamped at 0.7V (i.e. a diode voltage). Diode D may block current flowing from ground when a negative voltage is applied to gate G (e.g., −10V). Capacitor voltage VCs may be clamped at 10V during DC OFF. As in the case of circuit 100 of FIG. 1, the full charge and discharge of gate G may require discharging the voltage supply (e.g., Vext or Cp) by only −ΔQ.

Figure 6:
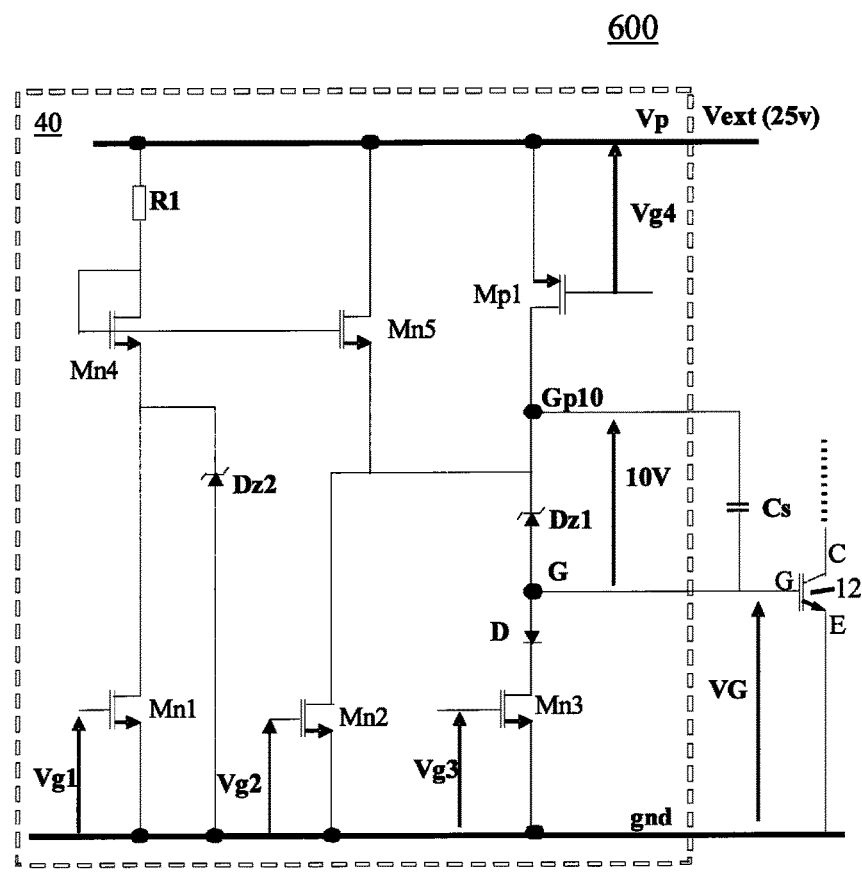
FIG. 6 schematically shows a detailed example circuit of the embodiment gate drive circuit of FIG. 4.
Figure 7:
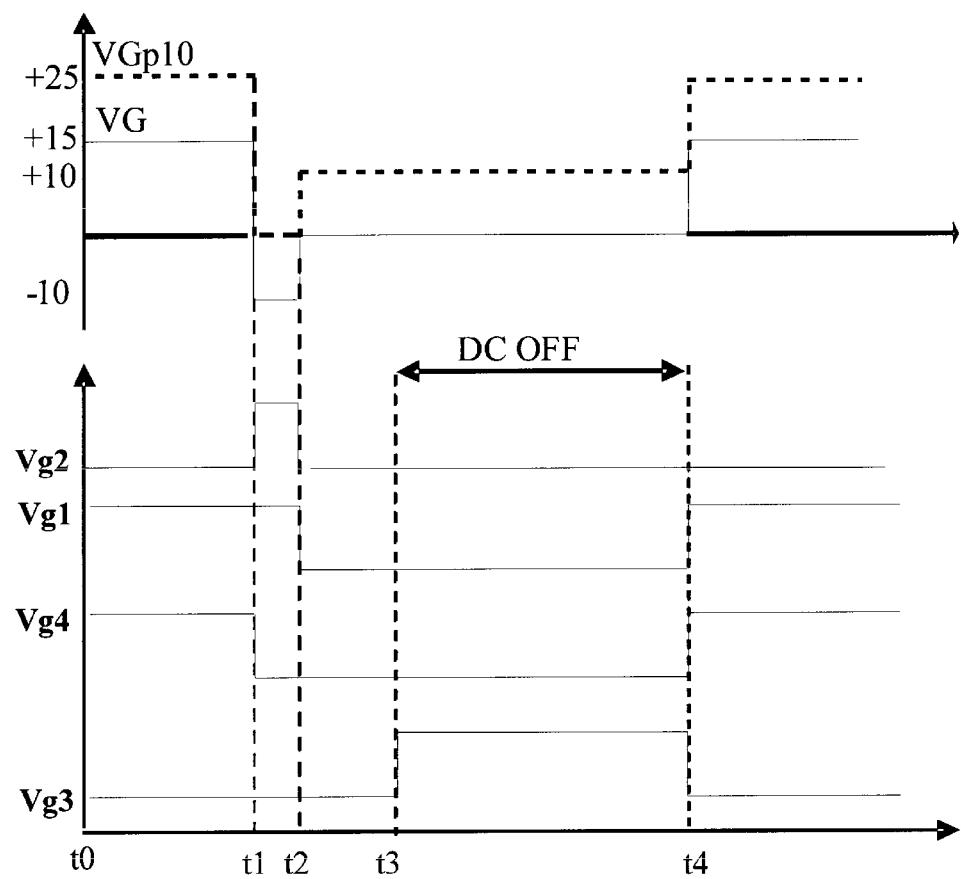
FIG. 7 is a timing diagram showing gate voltages in relation to a switching pattern based on the circuit of FIG. 6.

FIG. 6 schematically shows a detailed example circuit of the embodiment gate drive circuit 600 of FIG. 4. Previously identified features will not be re-identified. FIG. 7 is a timing diagram showing a gate voltage in relation to a switching pattern based on the circuit of FIG. 6. Switches sw1, sw2, and sw3 of FIG. 4 are implemented by the PMOS (i.e., Mp) and/or NMOS (i.e., Mn) transistors shown in gate drive 40 of FIG. 6. In particular, sw1 may correspond to Mp1, sw2 may correspond to Mn2, and sw3 may correspond to Mn3. FIG. 6 further shows nodes Vp (i.e., input voltage), Gp10, G, and gnd.

The branch formed by R1, Mn4, and Dz2 bias Dz2 (e.g., 10V Zener) when Mn1 may be off. Mn5 may be used as a follower such the source of Mn5 has the same voltage of the source of Mn4. Gate drive 40 allows for clamping node Gp10 at 10V. Mp1 electrically couples node Gp10 to Vp. Mn2 forces Gp10 to 0, to force gate G at −10V. After the negative pulse on gate G, the circuit Mn4, Mn5 and dz2 keep Gp10 at 10V, so the gate may be clamped at 0V (i.e., Vdz2−Vdz1=10−10). Dz1 may be the 10V clamp for Cs. Mn1 may also be driven to turn off the circuit Mn4 and Mn5.

Referring to FIG. 7, at time t0, the gate voltage of IGBT 12, VG, may be 15 volts, and the voltage VGp10 may be 25. To explain further, Mp1 may be switched on by Vg4 (i.e., a gate voltage signal). Mp1 may drive the necessary current to charge capacitor Cs to 10 volts, where Cs may be then clamped by Zener diode Dz1. Also, gate G may be driven by the current provided at Gout, forcing VG to 15 volts.

At time t1, a transient negative voltage drives gate G. That is, Vg4 may switch Mp1 off and Vg2 may turn Mn2 on. Mn2 may provide a path to ground for capacitor Cs, which may cause capacitor Cs to discharge and expels the charge on gate G with a negative potential of, for example, −10 volts. At time t2, Vg1 may be brought low. Vg1 may be brought low to activate the clamping of Gp10 at 10V using MN4, Mn5 r1 and Dz2. As Gp10 may be forced at 10V, gate G may be forced to be close to 0V.

At time t3, Vg3 may be brought high to keep voltage VG at 0 volts before and during DC OFF. At time t4, DC OFF ends, which includes high state transitions for Vg1 and Vg4 and a low state transition for Vg3, returning gate drive circuit 600 to its original state at t0.

Figure 8:
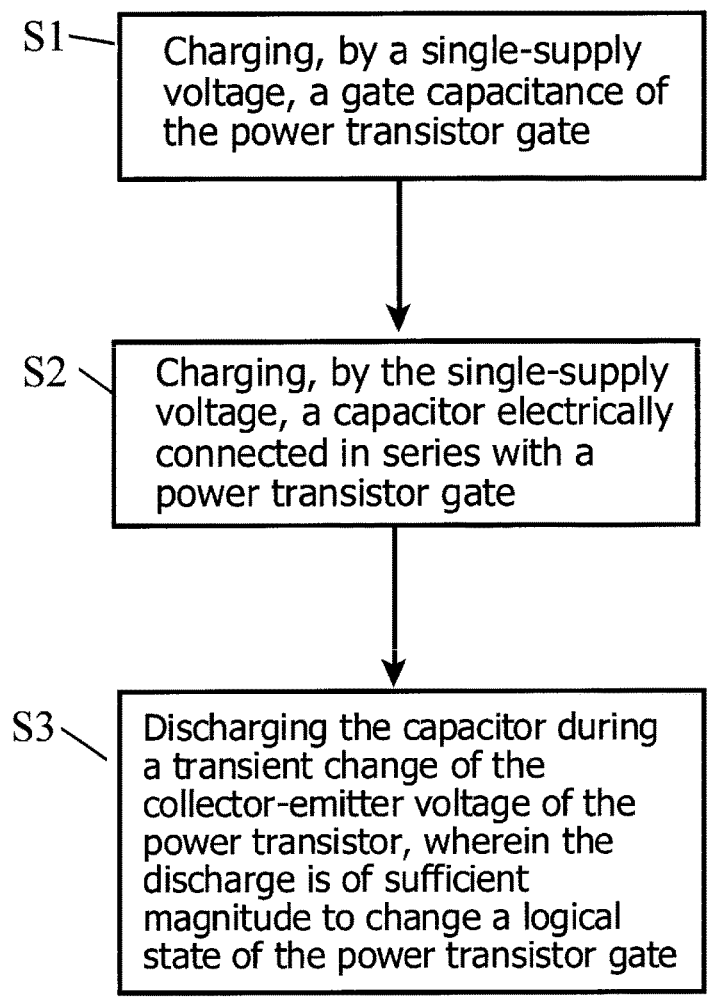
FIG. 8 shows a flow chart of an example of an embodiment method for driving an IGBT gate.

FIG. 8 shows a flow chart of an example of embodiment method 800 for driving an IGBT gate. At step S1, a single-supply voltage charges a gate capacitor of the power transistor gate. At step S2, the single-supply voltage charges a capacitor electrically coupled in series with a power transistor gate. The gate capacitor and the capacitor may be charged substantially concurrently.

At step S3, the capacitor may be discharged during a transient change of the collector-emitter voltage of the power transistor, wherein the discharge may be of sufficient magnitude to change a logical state of the power transistor gate (e.g., from a conducting state "on" to a non-conducting state "off" or "on" to "soft on"/"soft off").

The capacitor may have a capacitance of at least approximately one-hundred times greater than the gate capacitance. The capacitor may have a capacitance of approximately 10 µF, and the gate capacitance may be approximately 100 nF. Discharging the capacitor may comprise discharging the capacitor during a positive transient change of the collector-emitter voltage of the power transistor. The transient change of the collector-emitter voltage may be equal to at least 1 volt per nanosecond. In some embodiments (e.g., 400 A/300V for an electrical vehicle inverter), the transient change of the collector-emitter voltage may be 300V per 30 nanosecond or 10V/ns. The power transistor may be an IGBT.

The invention may also be implemented in a computer program for running on a computer circuit, at least including code portions for performing steps of a method according to the invention when run on a programmable apparatus, such as a computer circuit or enabling a programmable apparatus to perform functions of a device or circuit according to the invention.

A computer program is a list of instructions such as a particular application program and/or an operating circuit. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer circuit.

The computer program may be stored internally on computer readable storage medium or transmitted to the computer circuit via a computer readable transmission medium. All or some of the computer program may be provided on transitory or non-transitory computer readable media permanently, removably or remotely coupled to an information processing circuit. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating circuit to manage the execution of the process. An operating circuit (OS) is the software that manages the sharing of the resources of a computer and provides programmers with an interface used to access those resources. An operating circuit processes circuit data and user input, and responds by allocating and managing tasks and internal circuit resources as a service to users and programs of the circuit.

The computer circuit may for instance include at least one processing unit, associated memory and a number of input/output (I/O) devices. When executing the computer program, the computer circuit processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the PMOS and/or NMOS transistors may alternatively arranged by replacing PMOSs with NMOSs and vise-versa.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "electrically coupled" to each other to achieve the desired functionality. Further, "connected in series with" may include other components in between, but also serially connected.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner. For example, drive circuit 10 and 40 may be an IC driving one or more IGBTs and may drive both a high and low half of a bridge topology. Further still, drive circuit 10 and 40 may incorporate one or more capacitors that are shown outside the circuit element, including control module 44.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A gate drive circuit comprising:
   a first switch controlled by a first switch signal, the first switch electrically coupled to a single-supply input voltage node, the first switch electrically coupling the voltage node with a first capacitor if switched on;
   a second switch controlled by a second switch signal, the second switch electrically coupled to a ground node, the second switch electrically coupling the first capacitor with the ground node if switched on;
   the first capacitor, a first capacitor lead of the first capacitor electrically coupled to the first and second switches and a second capacitor lead of the first capacitor arranged to connect with a power transistor gate; and
   a Zener diode having a cathode electrically coupled to the first capacitor lead and an anode electrically coupled to the second capacitor lead, a maximum voltage across the first capacitor determined by a reverse breakdown voltage of the Zener diode.

2. The circuit of claim 1, wherein the circuit is an integrated circuit.

3. The circuit of claim 1 further comprising a second capacitor, the first capacitor lead of the second capacitor electrically coupled to the voltage node and the second lead of the second capacitor electrically coupled to the ground node.

4. The circuit of claim 1, wherein the capacitance of the first capacitor is at least approximately one-hundred times greater than a gate capacitance of the power transistor gate.

5. The circuit of claim 1, wherein the circuit is arranged to receive a control signal to control a gate drive output signal.

6. An IGBT module containing the circuit of claim 1, wherein:
   the IGBT module further comprises at least one IGBT transistor, and
   the gate of the at least one IGBT transistor is electrically coupled to the second capacitor lead of the first capacitor.

7. The circuit of claim 1 further comprising a third switch electrically coupled to the second capacitor lead of the first capacitor and the ground node.

8. The circuit of claim 1 further comprising:
a third switch electrically coupled to the second capacitor lead of the first capacitor and the ground node; and
a diode connected in series with the third switch, the diode cathode electrical coupled to the third switch and the diode anode electrically connected to the second capacitor lead.

9. The circuit of claim 8, wherein the circuit further comprises a controller arranged to transmit a control signal to control at least one of the first, second, and third switches.

10. The circuit of claim 1, wherein the ground node is arranged to couple to an emitter of the power transistor.

11. A method of driving a gate of a power transistor comprising:
charging a gate capacitance of the power transistor gate and
a capacitor electrically connected in series with a power transistor gate, the charging by electrically coupling a first lead of the capacitor to a single supply voltage node using a first switch controlled by a first switch signal, the charging of the capacitor clamped by a Zener diode connected in parallel with the capacitor; and
discharging the capacitor during a transient change of the collector-emitter voltage of the power transistor, the discharging by electrically coupling the first lead of the capacitor to a ground node using a second switch controlled by a second switch signal, wherein the discharge is of sufficient magnitude to change a logical state of the power transistor gate.

12. The method of claim 11, wherein the capacitor has a capacitance of at least approximately one-hundred times greater than the gate capacitance.

13. The method of claim 11, wherein the capacitor has a capacitance of approximately 10 µF and the gate capacitance is approximately 100 nF.

14. The method of claim 11, wherein discharging the capacitor comprises discharging the capacitor during a positive transient change of the collector-emitter voltage of the power transistor.

15. The method of claim 11, wherein the transient change of the collector-emitter voltage is at least 1 volt per nanosecond.

16. The method of claim 11, wherein charging comprises charging substantially concurrently the gate capacitance and the capacitor.

17. The method of claim 11, wherein the power transistor is an IGBT.

18. The method of claim 11 further comprising:
blocking current flowing from ground when a negative voltage is applied to the power transistor gate, the blocking provided by a diode having an anode connected to the power transistor gate and a cathode coupled to ground via a switch.

19. The method of claim 11, wherein an emitter of the power transistor is coupled to the ground node.

* * * * *